(12) United States Patent
Blemel et al.

(10) Patent No.: US 9,464,946 B2
(45) Date of Patent: Oct. 11, 2016

(54) METHOD, SYSTEM, AND APPARATUS TO PREVENT ARC FAULTS IN ELECTRICAL CONDUITS

(71) Applicants: Kenneth Gerald Blemel, Albuquerque, NM (US); Kenneth Dominic Blemel, Albuquerque, NM (US); Peter Andrew Blemel, Albuquerque, NM (US); Todd Francis Peterson, Albuquerque, NM (US)

(72) Inventors: Kenneth Gerald Blemel, Albuquerque, NM (US); Kenneth Dominic Blemel, Albuquerque, NM (US); Peter Andrew Blemel, Albuquerque, NM (US); Todd Francis Peterson, Albuquerque, NM (US)

(*) Notice: Subject to any disclaimer, the term of this patent is extended or adjusted under 35 U.S.C. 154(b) by 0 days.

(21) Appl. No.: 14/756,721

(22) Filed: Oct. 5, 2015

(65) Prior Publication Data

US 2016/0099126 A1    Apr. 7, 2016

Related U.S. Application Data

(60) Provisional application No. 62/071,789, filed on Oct. 3, 2014.

(51) Int. Cl.
| | | |
|---|---|---|
| H02H 5/04 | (2006.01) |
| G01K 11/18 | (2006.01) |
| G01K 11/06 | (2006.01) |
| G01R 31/02 | (2006.01) |
| H02S 40/34 | (2014.01) |
| H01H 85/055 | (2006.01) |
| H01H 85/26 | (2006.01) |
| H01H 85/42 | (2006.01) |
| H02H 3/08 | (2006.01) |
| H01H 71/14 | (2006.01) |

(52) U.S. Cl.
CPC ............... *G01K 11/18* (2013.01); *G01K 11/06* (2013.01); *G01R 31/024* (2013.01); *H01H 71/145* (2013.01); *H01H 85/055* (2013.01); *H01H 85/26* (2013.01); *H01H 85/42* (2013.01); *H02H 3/085* (2013.01); *H02S 40/34* (2014.12); *H01H 2205/002* (2013.01)

(58) Field of Classification Search
USPC ............................................ 361/93.8; 374/57
See application file for complete search history.

(56) References Cited

U.S. PATENT DOCUMENTS

| | | | | |
|---|---|---|---|---|
| 3,739,726 A | * | 6/1973 | Pintell ..................... | F42C 15/40 102/215 |
| 4,326,167 A | * | 4/1982 | Fehr .................... | G01R 31/3336 324/415 |
| 4,406,952 A | * | 9/1983 | Molen ..................... | H03K 3/53 307/104 |
| 5,889,118 A | * | 3/1999 | Delgado ............... | C08F 265/04 525/100 |
| 5,990,572 A | * | 11/1999 | Yasukuni ............. | H01H 39/006 180/271 |

(Continued)

*Primary Examiner* — Ronald W Leja

(57) ABSTRACT

A method, apparatus, and system for protection from fires and electrical shock of components used in construction of electrical conduits is disclosed using non-electrical means to disrupt flow of electricity before an arc fault, with the purpose to disrupt flow of current before risk of arcing. The purpose of this invention is to remove the hazard before an electrical arc occurs.

16 Claims, 4 Drawing Sheets

(56) References Cited

U.S. PATENT DOCUMENTS

| | | | |
|---|---|---|---|
| 6,218,921 B1 | 4/2001 | Eberts et al. | |
| 6,236,010 B1 | 5/2001 | Rostron | |
| 6,252,190 B1* | 6/2001 | Niemeyer | H01H 39/00 218/1 |
| 6,683,766 B1* | 1/2004 | Guo | H01H 9/548 361/42 |
| 7,277,822 B2* | 10/2007 | Blemel | G01M 5/0091 324/539 |
| 8,410,950 B2* | 4/2013 | Takehara | H01L 31/02021 136/244 |
| 8,963,678 B2* | 2/2015 | Feng | H01H 71/14 337/306 |
| 2005/0259373 A1 | 11/2005 | Hoopes | |
| 2006/0102593 A1 | 5/2006 | Shea et al. | |
| 2007/0021941 A1* | 1/2007 | Blemel | G01M 5/0091 702/182 |
| 2007/0116403 A1* | 5/2007 | Blemel | G01M 5/0091 385/12 |
| 2008/0208532 A1* | 8/2008 | Blemel | G01M 5/0091 702/183 |
| 2010/0277325 A1* | 11/2010 | Kopelman | G01J 5/58 340/595 |
| 2010/0326959 A1 | 12/2010 | Kanazawa et al. | |
| 2014/0231637 A1* | 8/2014 | Blemel | G01D 5/35345 250/227.14 |
| 2014/0233141 A1 | 8/2014 | Blemel | |
| 2016/0097685 A1* | 4/2016 | Blemel | G01K 11/06 374/57 |
| 2016/0099126 A1* | 4/2016 | Blemel | G01K 11/06 361/93.8 |

* cited by examiner

METHOD, SYSTEM, AND APPARATUS TO PREVENT ARC FAULTS IN ELECTRICAL CONDUITS

CROSS-REFERENCE TO RELATED APPLICATIONS

This application claims the benefit of Applicants' prior provisional application No. 62/071,789, filed on Oct. 3, 2014.

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISK APPENDIX

Not Applicable

LIST OF REFERENCED DOCUMENTS

U.S. Patent Documents

| Pat. No. | Issue Date | Inventor |
| --- | --- | --- |
| 7,590,496 | September, 2009 | Blemel |
| 7,356,444 | April 2008 | Blemel |
| 7,277,822 | October 2007 | Blemel |
| 7,974,815 | July 2011 | Blemel |
| 20140231637 | August 2014 | Blemel |
| 8,817,471 | August 2014 | Barna |

LIST OF NON-PATENT DOCUMENTS

1. M. W. Earley, P. E., et al, "2014 National Electric Code (NEC) Handbook," 2013 National Fire Protective Association, Quincy, Mass., Thirteenth Edition, p. 889-902.
2. J. Johnson, B. Pahl, C. J. Luebke, T. Pier, T. Miller, J. Strauch, S. Kuszmaul and W. Bower, "Photovoltaic DC arc-fault detector testing at Sandia National Laboratories," 19-24 Jun. 2011, Seattle, Wash., 37th IEEE PVSC.
3. J. Johnson, "Arc-fault detection and mitigation in PV systems: Industry progress and future needs," 28 Feb. 2012, Denver, Colo., NREL Module Reliability Workshop.
4. T. Croft, F. Hartwell, W. Summers, "American Electricians Handbook," Sixteenth Edition, 23 Jul. 2013, McGraw Hill Professional—Publisher.
5. Y. Otsubo, K. Yamaguci, "Journal of the Japanese Chemical Society," Vol 82, pp 557-560 (1961)
6. B. Yang, K. Armijo, E. Schindelholz, K. G. Blemel, K. D. Blemel, J. Johnson, "Photovoltaic Balance of System Connector Arc Fault Prognostics through Optical Monitoring," February 2015, Sandia Laboratory Technical Report SAND2015-0883 (Not for public release—For Official Use Only). 7. Underwriter Laboratory Photovoltaic (PV) DC Arc-Fault Circuit Protection 1699B http://ulstandardsinfonet.ul.com/outscope/outscope.asp?fn=1699B.html
8. D. Wolpert and P. Ampadu, "Managing Temperature Effects in Nanoscale Adaptive Systems", DOI 10.1007/978-1-4614-0748.

DEFINITIONS

1) Connectivity: Connectivity as used herein is a general term that includes wiring and associated attachment means used for the purpose of conducting direct Current (DC), Alternating Current (AC), or combinations thereof. The connectivity components are sometimes called connectors, plugs, terminals, receptacles and junction boxes among other names.

2) Thermal decomposition: State change of a chemical due to heat. For example, sodium bicarbonate ($NaHCO_3$) is unstable with respect to heating. According to Otsubo, cited as Reference #5 in the LIST OF NON-PATENT DOCUMENTS, solid $NaHCO_3$ begins to lose carbon dioxide and water around 100° C., with complete conversion to solid sodium carbonate $Na_2CO_3$ by 200° C. (Documented by Y. Otsubo and K. Yamaguci, Journal of the Japanese Chemical Society, Vol. 82, 1961 pp 557-560.) $NaHCO_3$ is used as a fire-suppression agent in some dry powder fire extinguishers.

3) Thermomorphic material: A substance that exhibits state change above a certain temperature.

4) Electric arc or arc discharge: An electrical breakdown of a gas that produces an ongoing plasma discharge, resulting from a current through normally nonconductive media such as air.

5) Thermal plasma: Energy generated by direct current and alternating current arc discharges.

6) Thermal energy: The internal energy present in a system by virtue of its temperature.

7) Pro-Active: To be preventive; e.g., taking action based on diagnosing a pre-condition.

8) Kinetic Energy of Gas Molecules: The average energy of a collection of gas molecules depends on the temperature of the gas and nothing else because gases are composed of a large number of molecules that behave like hard, spherical objects in a state of constant, random motion. The molecules move in a straight line until collision with another particle or the wall of a container. There is no force of attraction between gas molecules or between the molecules and the walls of the container. Because collisions between gas molecules or with the walls of the container are perfectly elastic, none of the energy of a gas particle is lost when it collides with another particle or with the walls of the container.

BACKGROUND OF THE INVENTION

Electrical arc faults generate white hot plasma and intense heat. Arc faults can be caused, for example, by a manufacturing defect; overload, or thermal expansion and contraction at the joints by the thermo-dynamics of current on the conductor. There is a plethora of publically available documents such as, "American Electricians Handbook" by T. Croft, F. Hartwell, and W. Summers (which is included in its entirety by reference herein), that teach electrical system designs and installations, as well as hazards related thereto. Other documents are publicly available that teach how to design systems that mitigate the related hazards with controllers, circuit breakers, ground fault detectors, and circuit interrupters.

Electrical systems typically include an infrastructure comprised of mechanical framework, electrical connectivity, and means for disconnecting, regulating, controlling, distributing, and modifying the electricity. Electrical arc-faults in connectivity can occur even when the operating voltages and currents are within normal bounds; such as, but not limited to, in the case of improper installation, unsafe design, small air gaps caused by differences in expansion of the conduit and metal contacts, or a manufacturing defect.

BACKGROUND OF THE INVENTION

For brevity, the following summary is focused on, but not limited to, photovoltaic (PV) systems that produce DC electricity directly from the sun's rays shining on PV modules that contain a number of interconnected solar cells. The electrical conductors that carry DC output from PV modules are conventionally connected to metal lugs in a "junction box" located on the back of the PV module. Several PV modules are often combined to aggregate the current or voltage in what is commonly called a PV string where several individual PV modules are joined by one or more electrical connectors that provide connectivity, usually in a series fashion. Several PV strings are often further joined by downstream connectivity components, such as a combiner box that aggregates the electrical power. Several combiner boxes are often connected in a tree-like fashion to large combiner boxes (sometimes called re-combiners) for aggregating power into a transmission line. In practice, one or more combiner boxes include over-current protection and isolation means, such as relays and breakers and insulated levers to deal with overloads and isolate short circuits.

Briefly stated, the present invention is a pro-active device to provide disruption of electrical connectivity without need for electrical devices.

In the case of an arc happening within connectivity, such as that of a PV system, the intense heat generated can result in a localized fire of combustible material used in the connectivity's construction and quickly spreads to proximal combustible materials.

The problem of arc faulting in PV connectivity is so serious that the Fire Protection Association (FPA) modified the 2014 National Electric Code (NEC) section 690.11 (listed as Reference #1 in the LIST OF NON-PATENT DOCUMENTS):

"Photovoltaic systems with DC source circuits, DC output circuits, or both, operating at a PV system maximum system voltage of 80 volts or greater, shall be protected by a listed (DC) arc-fault circuit interrupter, PV type, or other system components listed to provide equivalent protection. The PV arc-fault protection means shall comply with the following requirements:
(1) The system shall detect and interrupt arcing faults resulting from a failure in the intended continuity of a conductor, connection, module, or other system component in the DC PV source and DC PV output circuits.
(2) The system shall require that the disabled or disconnected equipment be manually restarted.
(3) "The system shall have an annunciator that provides a visual indication the circuit interrupter has operated. This indication shall not reset automatically."

The present invention differentiates from electrical arc fault protection devices that operate by detecting noise, radio frequency, light of plasma, radio, and other electromagnetic emissions of an electrical discharge. The approach of previous art is limiting, as it requires an arc-fault to be present before remediation is possible. Lightning bolts during storms result in false alarms. Other prior art use information from thermal sensors, infrared sensors, and cameras as a means to detect heat, an active arc, or a fire. However, such means are not-proactive and cannot detect initiation of an arc or fire in places obstructed from view.

Arc detection devices include circuit breakers, ground fault interrupters (GFI), arc fault detectors (AFD), and arc fault circuit interrupters (AFCI) which act to mitigate electrical safety hazards. Stopping the current flow is not always effective because the intense heat of the plasma generated by an electrical arc can cause either immediate fire or embers which ignite at a later time and spread to the supporting structure or nearby flammable material. GFI, AFD, ACFI, and circuit breakers do not pre-empt direct current arcing and cannot completely interrupt DC current at the source when the source of energy is unstoppable, as is the case with solar energy.

Arc faults in PV modules and PV connectivity are often caused by defective installation, and factory defects are widely documented. Ohmic heating caused by oxidation can also result in arc faults, as documented in the 2015 Sandia Laboratory Technical Report authored by B. Yang, K. Armijo, E. Schindelholz, K. G. Blemel, K. D. Blemel, J. Johnson, "Photovoltaic Balance of System Connector Arc Fault Prognostics through Optical Monitoring," (SAND2015-0883, which at the current time is not available in the public domain, "For Official Use Only" (FOUO), withheld from pubic release.) Ohmic heating due to corrosion or loose connections can also occur injunction boxes, combiner boxes, inverter boxes, and protection within the electrical distribution system. The ohmic heating may also degrade the conduction path in a manner that when sufficient energy is present, an arc fault can be established in the conduction path.

Human trauma and electrocution can result by touching the metal frame and/or an associated electrically conductive structure of a system component, which is electrified by an arc fault. When the supporting energy of the arc fault is DC, there are no zero-crossings as in alternating current and the arc does not self-extinguish, but continues as long as sufficient energy exists.

The Underwriter Laboratory 1699B Standard (in reference #7 in the LIST OF NON-PATENT DOCUMENTS, which is incorporated in its entirety by reference) requires DC arc-fault circuit protection devices intended for use in PV systems to mitigate the effects of arcing faults that may pose a risk of fire ignition under certain conditions if the arcing persists, because even though the electricity in the connectivity downstream from the PV module is shut off, the very hot plasma is likely to have caused conflagration of proximal combustibles in the module.

There is a pressing need for an improved means described in detail in the present invention that acts autonomously to take action to prevent arc-faults from happening. It would therefore be desirable to provide an apparatus with means for pre-arc, unsafe-condition detection and mitigation therein that works even when voltages and currents are within normal limits. Further, the protection system would meet the NEC Section 690.11 and other NEC requirements by annunciating unsafe conditions in PV system equipment and associated wiring. The protection system would provide mitigation before the arc-fault occurs, shutting down the PV component with an unsafe condition; therefore preventing fire damage and human disasters by properly isolating only the unsafe component in a safe manner and alerting the system owner or consumer for replacement or reinstatement.

BRIEF SUMMARY OF THE INVENTION

The present application teaches a protection apparatus for improving the safety of electrical power distribution systems from the damage of an electrical arc fault in a connectivity junction by detecting heat generated therein, which is unrecognized by ordinary means, and which eventually would result in an electrical arc with resulting fire, electrical shock, or hazards. The focus herein is on applying the protection apparatus to associated connectivity wherein kinetic energy of a gas such as, but not limited to, carbon dioxide produced by temperature causing decomposition of sodium bicarbonate, is detected and risk of a future arc fault raises as the force increases, enabling mitigation of the condition before the arc fault occurs.

The present application describes use of kinetic energy due to chemical state change caused by elevation in temperature to isolate unsafe conditions in virtually any electrical system connectivity component. The present application teaches actions that isolate the offending component in a manner that functional modules can remain operational and that unfaulted parts of a system remain functional.

While the present specification uses the example of PV balance of system connectors to teach the principles, a person familiar with electrical systems would realize that connectivity devices are components found in most, if not all, electrical systems.

DISCUSSION OF PRIOR ART

In preparing this application, a search of World Intellectual Property Organization (WIPO) member websites found over two hundred issued patents for detecting and protecting after electrical arc faults happen in chafing, overload, and wire short situations. None of these patents deal with methods or system with means to pre-empt DC arcing hours, days, or even months before the discharge occurs. However, several patents and limitations thereof which are overcome by the present application are presented below.

There are numerous examples of prior art, including patents and publications that present principles, methods, systems, apparatus, and techniques for detecting and mitigating active arc-faults when they occur. Several companies have begun embedding electronics into PV components to detect DC arc-faults when they occur. There are numerous examples of art that teach detecting the arcing of a "load-side short," as experienced when electrical equipment fails, causing fuses to blow due to current increase of electricity supplied by a generator or power facility. These methods cannot work well when sunlight is the energy source, as is the case with PV modules. This means a solar-source arc continues, due to the sun's rays (either direct or reflected from the moon) unless the module is covered somehow to occlude the sunlight; or the connectivity upstream is disrupted.

PRIOR ART

While there are numerous patents for detecting current overload which cause fire in panels and electrical outlets, our search of the World Wide Web and the USPTO site patent database did not find issued U.S. patents or U.S. patent applications that teach direct mitigation of unsafe conditions without need for an electrical device such as a temperature sensor. Nor were there examples of prior art providing mitigation when current and voltage are within acceptable limits. The following are instances of prior art that a) use active monitoring of output of symptoms such as current, light, or radio frequency emissions with electrical means to determine a PV system is arcing; and b) use of electrical means to determine that insulation is degrading.

US Patent Application 2014/0231637 by Blemel et al teaches measuring light intensity with a photodetector to sense thermal damage due to resistive heating or arcing.

U.S. Pat. No. 8,817,471 by Barna teaches adding release of a fire suppressant after detecting heat of an electrical fire in a junction box.

U.S. Patent Application 2010/0277325 A1 by Kopelman teaches monitoring infra-red emissions with an electronic sensor to detect overheated junctions.

U.S. Pat. No. 8,576,521, issued to Rodgers, et al, teaches a controller-based detection system configured to adaptively learn to distinguish between detected light that is indicative of an arc-fault event and detected light that is not related to an arc-fault event. During normal operation of the electrical power system, the adaptively-determined one or more detection algorithms are utilized to identify arc-fault events in the electrical power system. Rodgers, et al does not teach utilizing ohmic heating to diagnose risk of arc fault; or use of kinetic energy resultant from ohmic energy to disrupt connectivity before an arc-fault happens.

U.S. Pat. No. 8,410,950, issued to Takehara, et al, teaches an electronic monitoring module for measuring voltage and current of PV panel output, comparing measured values against minimum and maximum values saved in the monitoring module, and outputting an alarm signal when a measured value is outside a range defined by the minimum and maximum values.

H. Bruce Land III, Christopher L. Eddins, and John M. Klimek (Land, et al), in a paper publicly available on the web entitled, "Evolution of Arc-Fault Protection Technology at APL," claims that an electrical fire is reported in the United States every five minutes. This paper documents that Applied Physics Laboratory (APL) created an AFD system to detect and quench these fires. This paper also documents that APL developed electronically operated circuit breakers that are the follow-on to AFCI and GFI breakers.

U.S. Pat. Nos. 7,590,496, 7,356,444, 7,277,822, and 7,974,815 to Blemel teach using damage to sensitized translucent sheets, strips, or strands (including but not limited to translucent glass and polymer), arranged on the surface or within conduits, to detect damage to the conduit such as caused by incision, solvent, or flame.

According to publications at the time of submitting this application, experts in solar systems (see list of non-patent documents) state there are currently no technologies other than that described in this application that can operate without use of electronic sensors to detect and mitigate the risk of a DC arc in electrical connectivity before the arc happens.

None of the above patents, patent applications, and publically available prior art teach utilizing non electronic means to disrupt flow of electricity to mitigate an unsafe condition before sustained electrical arcing occurs.

Advantages Over Prior Art

The following summarizes advantages of the present invention over prior art. 1) The present invention provides means to utilize the ohmic heating phenomena which is symptomatic of progression to an electrical arc fault at a higher temperature; 2) can be added during manufacturing of the connectivity; 3) can be plugged-in during installation of connectivity; 4) can be added after the connectivity is installed to provide protection to existing electrical systems; 5) has no electronic circuit which could fail; 6) has no electrical or mechanical contactors that make and break the connection; 7) can be embodied to cause disruption and eliminate further risk; 8) is easy to install or integrate into the connectivity. 9) is immune to producing false alarms due to naturally occurring RF emissions; 10) operates before there is a significant precursor change in voltage or current produced by an arc event; 11) is able to operate when repeated hot/cold cycles result in very low ampere electrical discharges across a sub-millimeter size gap at joints within the connectivity component; or there is a factory defect in the connectivity component; or an installer does not make a proper connection causing a gap in the joint small enough to cause a self-extinguishing discharge which will subsequently result in an arc fault with associated high temperature plasma energy.

Using the heat generated in a connectivity junction that precedes an arc fault to disconnect the flow of current is novel.

It is a very significant advantage over prior art that the present invention meets and exceeds the 2014 NEC 690.11 requirement for mitigating arcs in PV systems by freeing the unsafe component before an arc occurs.

It is an important advantage over prior art that the present invention is simple, low cost, and easy to implement because there are hundreds of thousands of PV systems installed and producing electricity today.

The simplicity of the innovation is an important advantage over prior art that teaches complex means for detecting an electrical arc fault by observing the light caused by the arc, or the radio frequency emissions of the arc, or change in current caused by the arc, and then interrupting the current flow with a device such as a circuit breaker, relay, or fuse.

The present invention is different than prior art to detect an electrical arc-fault by teaching utilizing the heat generated by the hazardous condition that to disrupt the flow of electricity.

This invention is contrary to prior art; utilizing the ohmic thermal rise before an arc results with action to disrupt flow of current before arcing happens.

The present invention gives a successful implementation before the electrical arc fault occurs; providing successful implementation of the intent of the United States National Electric Code (i.e., to prevent fire and personal injury due to electrical arc faults).

The present invention is proactive in providing protection from fire due to deterioration of PV connectivity as well as the risk of injury and death from consequences of the fire.

The present invention also teaches proactive protection to degradation of junctions in junction boxes, combiner boxes, inverters, and power distribution conduits; as well as junctions in wiring harnesses.

The present invention omits the need for electronic modules and sensors used to recognize the artifacts of a live electrical arc fault, such as a flash of plasma, radio frequency emissions, current rise, and simultaneous voltage drop.

REFERENCE TO NUMERALS USED IN DRAWINGS

The components identified in the figures
(1) Electrical Conductor
(2) Male electrical connector
(3) Female electrical connector
(4) Slot
(5) Separable Body
(6) Electrically Conductive Guide
(7) Shell
(8) Dielectric Material
(9) Conductive Pin
(10) Gas Impermeable Cavity
(11) Spring
(12) Magazine
(13) Thermomorphic substance
(14) Barrier
(15) Channel
(16) Retainer
(17) Insulation
(18) Detent
(19) Comparator
(21) Entity
(22) Semaphore
(23) Communicator

DETAILED DESCRIPTION OF THE SEVERAL VIEWS OF THE DRAWINGS

Various embodiments of the invention are disclosed in the following detailed description and accompanying drawings. Each drawing teaches how to implement the techniques and or components to effect the purposes of this patent.

Figure 1A:
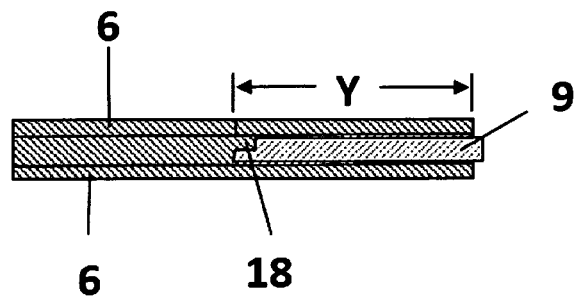
FIG. 1a depicts a cutaway top view of a slotted electrically conductive guide with left end for accepting a male electrical conductor and right end for accepting a conductive pin. A slot on the top allows a barrier to move a distance "Y" sufficient to forcibly eject a conductive pin fitted into the right end of the electrically conductive guide.

Referring now to FIG. 1a, which is a cutaway top view of hollow slotted electrically conductive guide (6) that holds conductive pin (9). Detent (18) at the left end of conductive pin (9) is positioned under the left end of slot (4) (not shown) to enable coupling with a mechanical means to forcibly move conductive pin (9) right-wise distance Y until conductive pin (9) frees. Detent (18) couples to a mechanical means to force movement of conductive pin (9).

Figure 1B:
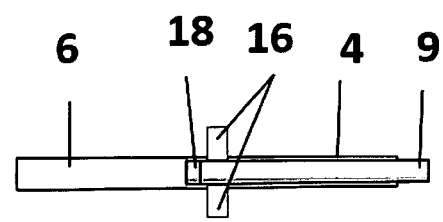
FIG. 1b depicts a top view of the apparatus in FIG. 1a constructed with a slot along the top side that enables a mechanically coupled means to move and free a conductive pin fitted into the right end of the electrically conductive guide.

Referring now to FIG. 1b which is a top view of the apparatus diagrammed in FIG. 1a. An electrically conductive guide (6) surrounds conductive pin (9). Detent (18) at the left end of conductive pin (9) couples with a mechanical means to mechanically move conductive pin (9) along slot (4). FIG. 1b also depicts a top view of a protruding retainer (16) which prevents movement of conductive pin (9) until ohmic heating is sufficient to produce a thermomorphic force that initiates movement of conductive pin (9).

Figure 1C:
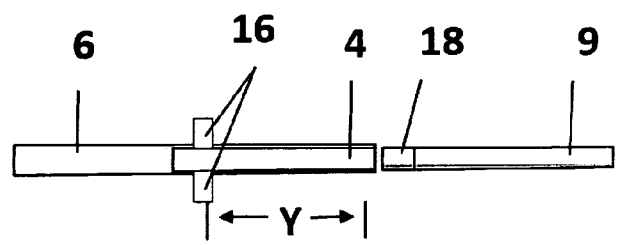
FIG. 1c depicts a top view diagram of the apparatus in FIG. 1b after a mechanical means in contact with the conductive pin has transited distance Y, freeing the conductive pin.

Referring now to FIG. 1c, which depicts a top view of the apparatus diagrammed in FIG. 1b after activation to protect against a DC arc. FIG. 1c depicts the configuration after a force applied at detent (18) of conductive pin (9) within slotted electrically conductive guide (6) has transited right-wise along slot (4) distance "Y" freeing conductive pin (9). FIG. 1c also depicts top view of protruding retainer (16).

Figure 2A:
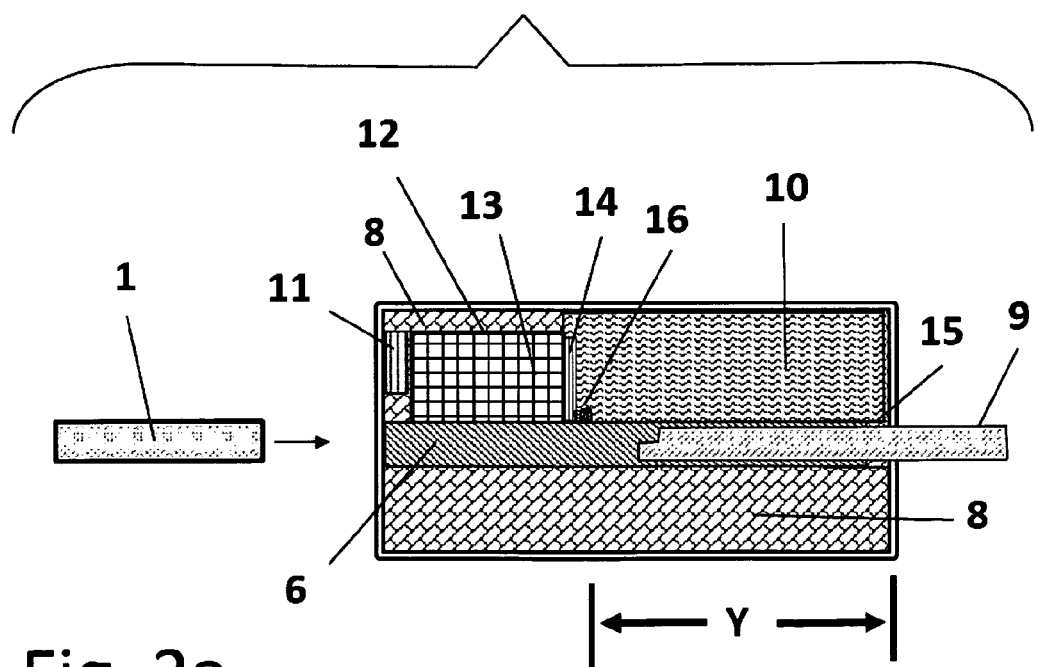
FIG. 2a is a cutaway, side view diagram that depicts an electrical connector with a single conductor connector before activation of the thermomorphic substance with the functions and components constructed according to the teaching of this application.

Referring now to FIG. 2a, which is a composite cutaway side view diagram of an exemplary apparatus constructed according to the teaching of this patent before heat causes state change of thermomorphic substance (13) within pliant magazine (12). Conductor (1) represents an electrical wire. Electrically conductive guide (6) is within a channel (15) through dielectric material (8). Spring (11) is shown in its compressed state, prevented from releasing stored energy by magazine (12) which is held in place by barrier (14), itself held in place by retainer (16). An electrically conductive pin (9) is shown surrounded within electrically conductive guide (6), enabling flow of electrical current. Distance Y is of sufficient length to assure freeing of electrically conductive pin (9) from electrically conductive guide (6). Barrier (14) moves axially in gas impermeable cavity (10) when energy released on heating of the thermomorphic substance (13) expands pliant magazine (12).

Figure 2B:
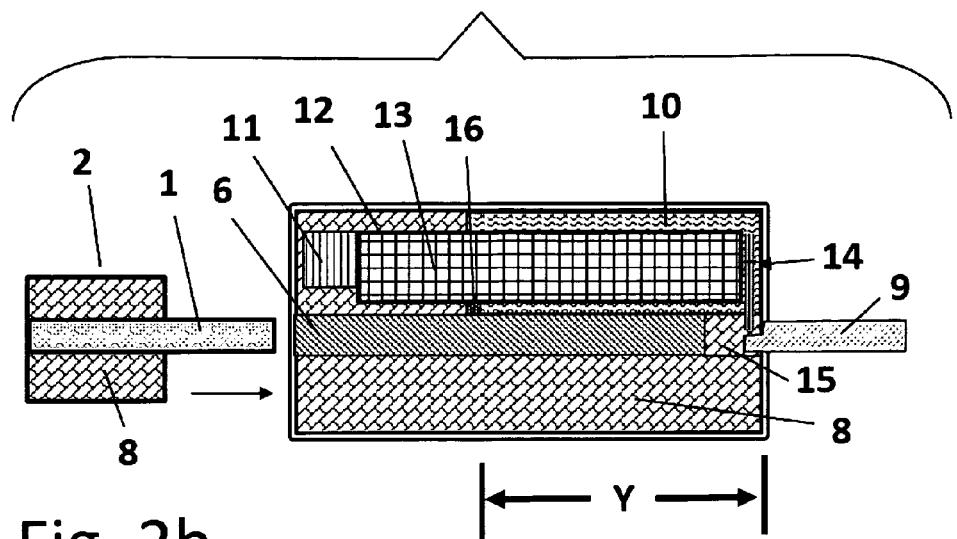
FIG. 2b is a cutaway, side view diagram that depicts the apparatus of FIG. 2a after heating activates the thermomorphic substance.

Referring now to FIG. 2b, which is a cutaway side view diagram of the apparatus in FIG. 2a constructed according to the current patent. FIG. 2b shows the state of the apparatus after force produced by heating thermomorphic substance (13). An electrical conductor (1) protruding from a male electrical connector (2) passes into an electrically conductive guide (6) within channel (15), which passes through dielectric material (8) within the apparatus. The metal of the electrically conductive guide (6) has oxidized and become resistive. Ohmic heating increased the temperature within the gas impermeable cavity (10). Heating of the thermomorphic substance (13) has expanded the pliant magazine (12), causing barrier (14) to rise over retainer (16), which in turn caused spring (11) to expand. The sum of forces released by spring (11) and energy of thermomorphic substance (13) pushed moveable barrier (14) past the retainer (16) axially Y distance, freeing electrically conductive pin (9) from electrically conductive guide (6), thereby disrupting the connectivity. Slot (4) in the upper surface of electrically conductive guide (6) depicted in FIG. 2a is hidden from view (not shown) due to the side view perspective. The diagram is meant to be representative and variants can be constructed that would work as well.

Figure 3:
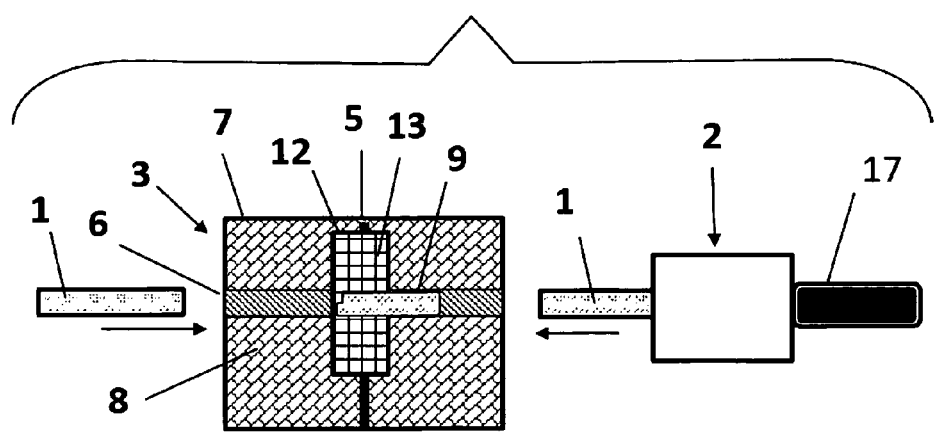
FIG. 3 is a composite cutaway side view diagram of an apparatus to protect against DC arcing, which is depicted as a female connector constructed with a pliant magazine that expands due to sufficient internal force generated by heating of thermomorphic substance with force moving a conductive pin axially in an electrically conductive guide ejecting a male connector opening the connectivity. A diagram of an electrical conductor is depicted on the left and a male electrical connector is depicted on the right of the apparatus.

Referring now to FIG. 3, which is a composite cutaway side view diagram of an apparatus to protect against DC arcing, constructed according to the teaching of the current patent before separation. On the left of FIG. 3 is a conductor (1) from an insulated wire (insulation not shown). The center of FIG. 3 is comprised of a female electrical connector (3) made of dielectric material (8) with a separable body (5) is shown with a pliant magazine (12) within. Electrically conductive guide (6) passes through the length of the female electrical connector (3). The frangible magazine (12) contains thermomorphic substance (13) such as, but not limited to, sodium bicarbonate. The left portion of the electrically conductive guide (6) holds conductor (1) entering from the left. A right portion of electrically conductive guide (6) is hollow to accept conductor (1) from male electrical connector (2) on the right. The central portion of the metal electrically conductive guide (6) holds electrically conductive pin (9). The right portion of the electrically conductive guide (6) mates conductor (1) from a male electrical connector (2), which enters from the right. Force caused by ohmic heating causes state change of thermomorphic substance (13), expands pliant magazine (12), causing electrically conductive pin (9) to move, ejecting conductor (1) on the right, disrupting current flow. Extension of the length of conductor (1) with wire with surrounding insulation (17) is shown on the right. The diagram of electrically conductive guide (6) and magazine (12) are meant to be representative and variants can be constructed that would work as well.

Figure 4:
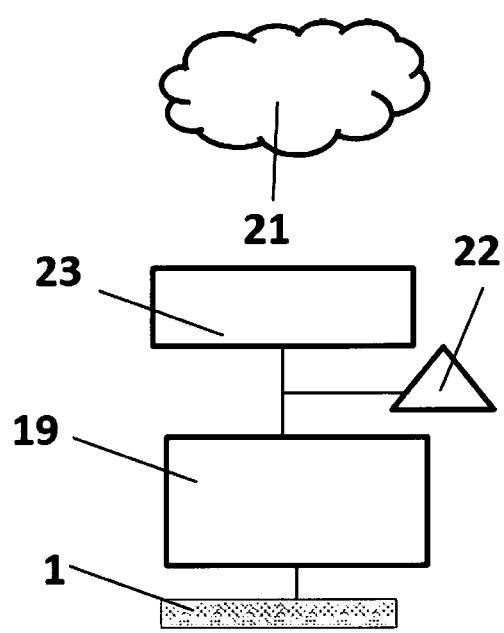
FIG. 4 depicts a device for warning responsible entities of excessive heating of junctions of electrical connectivity employing a semaphore or wired or wireless communicator. The device employs a comparator that diagnoses rapid decrease in energy on a conductor serving a junction or connector.

Referring now to FIG. 4 which depicts diagrammatically a device for warning responsible entities (21) of change in electrical power carried on a conductor (1) that carries power from a connective apparatus (not shown) constructed according to the teaching of this patent. A comparator (19) detects permanent reduction in one or more parameters of electricity carried by the conductor (1). The comparator (19) deploys a semaphore (22) or transmits a signal to one or more entities (21) via wired or wireless communicator (24).

DETAILED DESCRIPTION OF THE INVENTION

The following is a detailed description describing exemplary embodiments to illustrate the principles of the invention. The embodiments are provided to illustrate aspects of the invention, but the invention is not limited to any embodiment. The scope of the invention encompasses numerous alternatives, modifications, and equivalent; it is limited only by the claims.

Numerous specific details set forth in the figures and descriptions are provided in order to provide a thorough understanding of the invention and how to practice the invention. However, the invention may be practiced according to the claims without some or all of these specific details. For the purpose of clarity, technical material that is known in the technical fields related to the invention has not been described in detail so that the invention is not unnecessarily obscured. For example, the disruptor could be manufactured integral to either a male electrical connector or a female electrical connector or both. Also, the thermomorphic substance that produces kinetic energy sufficient to cause disruption of connectivity can be a compound comprising one or more ingredients including a substance such as, but not limited to, an essential oil, a salt solution, or other means to enhance production of kinetic energy. A dye or fluorescent material that disperses during state change could be mixed with the thermomorphic substance.

References are cited that provide detailed information about electrical systems, unsafe conditions of electrical systems, and approved techniques for implementing protection systems. However, a person with ordinary experience in instrumenting systems would understand the application also applies to steam and chemical piping systems that overheat.

The embodiments of the invention set forth herein relate to detection, mitigation, and isolation of unsafe connectivity that incorporates the present invention for purposes of properly disconnecting the flow of electricity within in the connectivity.

In a preferred embodiment, a socket contact assembly comprises a proximal end and a distal end, wherein the distal end is configured to be connected to a conductor, and the proximal end includes at least an outer surface. The socket contact assembly is joined to a disruptor body comprising a proximal end and a distal end, wherein the proximal end includes a female electrical connector.

One or more chambers within the disruptor body are filled with a compound chosen for the property of rapid state change above a selected temperature, with the purpose to produce sufficient pressure (kinetic force) within the interior of the disruptor body to overcome the force of friction securing the disruptor body to the socket contact assembly, resulting in physical separation of the connection of the socket contact assembly and the conductor, thereby disrupting flow of electrical current. In an alternate embodiment, the force causes movement of the electrically conductive guide, which frees the connectivity.

A technical contribution for the disclosed protection system is that it provides for unique autonomous mitigation of unsafe conditions at junctions of connectivity, such as an electrical system, and properly disconnecting the unsafe connectivity with an interrupter device before the unsafe condition that, if left unattended, could result in an arc or ground fault (in the case where conduits contain both anode and cathode), and the consequential damages thereto.

Another technical contribution for the disclosed protection system is that it provides means for containing a dielectric chemical such as sodium bicarbonate for quenching a plasma that results when conductors carrying elevated current at a juncture are insufficiently separated with respect to speed of separation or distance of separation. Without limitation, the quench can be accomplished by the noncombustible gas such as carbon dioxide displacing oxygen or by filling the void formed when the conductor separates.

One exemplary embodiment of the present invention is an apparatus fittable at a connectivity juncture or integral to the connectivity that comprises at least one disruptor that releases sufficient kinetic energy to force separation and unresettably open the circuit when a temperature internal to the connectivity rises to a desired trigger point below the temperature that causes an arc to form. The purpose of the disruptor to forcibly open the circuit served by the connectivity to open and remain open when an excessive temperature condition is detected before the arcing happens.

In a broad embodiment, the present invention extends to use in other equipment, which is subject to risk of damage, fire, and loss of property due to aging and manufacturing defects.

For example, in the case of manufacturing a connector for use in establishing connectivity of a PV system, the embodiment would be constructed with, but not limited to, meeting the appropriate regulatory requirements.

In another example, in the case of manufacturing a PV system component such as, but not limited to, a DC to AC inverter, the embodiment would be situated in connectivity proximal to inverter components and wiring therein that could have an unsafe condition. The device would generate an unsafe condition signal that raises an alarm and the disrupter would interrupt current flow by opening a circuit or short-circuiting power as appropriate to mitigate the unsafe condition.

Best Embodiment

In a best embodiment, the apparatus is constructed with material selected for properties that will optimize detection and mitigation of unsafe conditions, such as, but not limited to, release of sufficient kinetic energy above a certain temperature to forcibly open the connectivity. Further, the nature of constituents used in the embodiment is selected so that any byproducts produced are non-toxic, non-flammable, and, further, are dielectric to provide arc quench.

In a best embodiment, the sensor sends an unsafe condition signal when a first threshold is exceeded and releases kinetic energy on exceedance of a higher temperature, which indicates a very unsafe condition, but lower than a temperature that indicates imminent arc formation.

In a best embodiment, pre-detection of an emerging unsafe condition with an optional sensor device would be continuous when electrical current is carried by the conductivity. This approach would detect heating due to an arc or an external fire. Should such conditions occur, the sensor device would send an unsafe condition signal, which results in an alarm and the associate connectivity system component being de-energized by disconnecting the flow of electricity with a disruptor according to the teaching herein.

Construction Of Embodiments

The US National Electric Code (2014 edition, (listed as Reference #1 in the LIST OF NON-PATENT DOCUMENTS) requires that components and conduits used in solar systems must operate at temperatures up to 85 degrees Celsius. The degree of heat generated by flow of electricity in connectivity is represented by the relationship Ohmic Energy=Current*Resistance (E=I*R). The relationship means that either increased resistance or increased current would eventually result in a DC arc with the hazards that the DC arc entails. A temperature of around 200 degrees Celsius identified as sufficient for sustained arcing is documented by B. Yang, et al, in reference #6 in the LIST OF NON-PATENT DOCUMENTS which is incorporated in its entirety by reference.

In another embodiment, the disruptor device can augmented with a sensor built into or inserted into the body. In the case of PV connectivity, the sensor can be produced by placing a portion of translucent media that changes optical transmissivity above 85 degrees Celsius which is the rated temperature for PV connectivity. The media, such as, but not limited to High Density Polyethylene (HDPE), is positioned in close proximity to the components that exhibit resistive electrical heating phenomena, also known as "ohmic heating." Ohmic heating in the connectivity of an electrical system can result in localized elevated heating that results in arcing.

In order to produce a sensor device according to the teaching of this patent, select from sensitized media that produce a measurable response sufficiently below the temperature where arcing is expected to occur. For example, according to the American Society of Test and Measurement Engineers (ASTME), translucence of HDPE decreases above 104 degrees Celsius; a point the ASTME calls, "Tm." Further, HDPE melts at 150 degrees Celsius, a point the ASTME calls, "Tc." Alternatively, the media, for example, could be a semiconductor which becomes a conductor (or non-conductor) above a certain temperature based on its composition.

Embodiments, without limitation, can be constructed without an electronic circuit for risk mitigation; or can be constructed at additional cost with a digital circuit, an analog circuit, or a combination thereof. The embodiment could, according to need to communicate, be able to receive analog and digital input signals. The design could, according to need to take pre-action, also have analog and/or digital outputs to provide actuation such as, but not limited to a status indicator light or semaphore. The circuitry could be designed with the ability to be unaffected by the DC current on the conductors. The design could include a means for sending data and information such as, but not limited to, coded modulation onto the current carried by the conductor within the connectivity; or wireless means, for sending information using approved protocols such as, but not limited to, Bluetooth™ or Ethernet.

Measurement means for determining an unsafe condition could include, but is not limited to, using an electronic circuit to measure temperature directly or indirectly. For example, indirect means could be accomplished by measuring change in a parameter affected by temperature. An appropriate timing delay could be built in or incorporated so as not to generate false alarms.

The energy source for the sensor circuitry, could be, but is not limited to, a tap of energy carried by the conductor, an inductive coil surrounding the conductor, or a solar cell. The energy source, if any, should be selected for operating as long as possible and to hold sufficient charge for as long as the system component wherein the sensor is installed.

Digital or analog information, including but not limited to, temperature measurements and alerts produced by the sensor, can be delivered to a remote device. The remote device could be located in a junction box or a combiner box, or an electrical system health monitoring and control center. The information could be used, for example, to produce an estimate of the remaining time before an arc will occur by using an algorithm based on parameters including, but not limited to, the rate of increase in temperature sensed and time. The means to deliver the information could be wireless using a protocol such as but not limited to Bluetooth or Wi-Fi (such as, for example only, a modulation on the conduit DC or AC signal).

The present patent teaches a kinetic apparatus that, by design, operates before a sustained arc is produced due to temperatures within electrified connectivity. (According to B. Yang, et al, cited previously as Reference #6 in the LIST OF NON-PATENT DOCUMENTS, the temperature sufficient to sustain a DC arc is 200 degrees Celsius.) The disrupter is operably situated in a connectivity junction for the purpose of having kinetic energy forcibly open an overheated junction below the temperature where arcing occurs.

The apparatus is wholly non-electric based on use of compounds, such as, but without limitation, powdered sodium bicarbonate ($NaHCO_3$) within a structure designed to expand, vent, or fracture to permit release of the kinetic energy. In the case of $NaHCO_3$, the byproduct of carbon dioxide gas provides the kinetic force. (Research published by Y. Otsubo and K. Yamaguci, which is listed as #5 in the LIST OF NON-PATENT DOCUMENTS and is incorporated in its entirety by reference, explains that granules of $NaHCO_3$ decompose and release carbon dioxide gas beginning around 100 degrees Celsius with release of carbon dioxide gas complete by 200 degrees Celsius.) Sodium bicarbonate, is also used in electrical fire extinguishers because heating releases carbon dioxide.

The disruptor device should be constructed to provide an amount of kinetic force to permanently open the connectivity at a temperature below that which produces an electrical arc fault.

The sources of the kinetic energy could be, but are not limited to, a miniscule coating of polymerized cyclotrimethylenetrinitramine; a compaction of granules that decompose producing copious gas above a certain temperature, for example sodium bicarbonate; a mixture of chemicals that react with production of gas above a certain temperature, for example powdered starch and potassium carbonate; an effervescent liquid; and microencapsulated media that release gas above a certain temperature.

The material used for producing the kinetic energy should be encapsulated, such as, but not limited to, a suitable polymer, metal, or glass of strength that provides accumulation of force needed to cause assured disruption of flow of electricity by separation of the electrical conduits within the connectivity. The accumulated force could be augmented with a mechanical means such as, but not limited to, a pre-stressed spring that uncoils when unstressed. The encasement would also protect from moisture which could alter the effectiveness of the charge. Safety, toxicity, flammability, reliability, stability, and durability are key parameters to be considered in making a selection.

In accordance with yet another aspect of the present invention, the material used to produce kinetic energy of the disrupter and packaging, if any, should be reliable and stable for the expected service life of the connectivity.

In accordance with a third aspect of the present invention, the apparatus could include features such as, but not limited to, a self-test function, ability to annunciate, to be interrogated by wired or wireless means, and interrupt current flow by opening the circuit to stop the flow of electricity.

To test the functionality of the system, create an apparatus for performing a series of measurement tests that produce data to determine the response characteristics of the sensing media to change in resistance or current versus temperature. For example, after measuring the resistance, incrementally increase current with a calibrated current source, such as a variable transformer. Increasing the resistance can be accomplished by placing the corrodible test article in a salt-air environment at an elevated temperature to quicken the corrosion and thus the resistance. The change in resistance due to corrosion of the junction under test will cause the sensed parameters to increase or diminish.

In yet another embodiment, additionally include a comparator (such as a flip flop circuit, array of logic gates or differential amplifier) settable at a preferred temperature with the purpose to generate an unsafe condition signal. The unsafe condition criteria could include, but is not limited to, one or more of a threshold value.

In accordance with another aspect of the present invention, if the comparator logic requires electricity to operate, it is connected to electricity carried by the connectivity or electricity from another source, such as a battery or capacitor energized by kinetic energy or solar energy.

Reduction to Practice

In April 2014, under an appropriate non-disclosure agreement, Sandia National Laboratories (SNL) was commissioned to explore the temperature at which a DC arc initiates in a single conductor connector of the type used in PV connectivity. This SNL research resulted in Sandia Laboratory Technical Report SAND2015-0883, February 2015, (Not for public release—For Official Use Only) and determined that a first arc in a PV connector occurs in PV connectors at around 200 degrees Celsius. In this research, SNL also explored whether melting of translucent media could be applied successfully to detect arc-faults in PV connectors. The concept being that in the event of hot spots, which are believed to precede arc-faults, a proximal translucent polymer strand coupled to a photon detector would melt and the light signal would not reach the photon detector, causing a logic circuit to signal an interrupter device of a pre-arc condition. An alternative is an illuminated proximal translucent polymer strand coupled to a photon detector would exhibit reduced transmissivity and the reduced light signal reaching the photon detector would cause a logic circuit to signal an interrupter device to open the connectivity and stop the flow of current.

We, the inventors, explored using the phenomena of thermal response to develop a method based on temperature affects that could be applied to predict and prevent an arc-fault in connectivity above 100 degrees Celsius and below the 200 degrees Celsius at which SNL research found a DC arc initiates. The concept being that in the event of increased resistive heating caused by conductor corrosion within a connector, the temperature within the connector body would measurably change and reflect degree of risk. When the amount of change increases significantly, a signal would be produced to an integral interrupter means to disconnect the connector and stop the flow of current.

We, the inventors, explored thermal effects on translucent polymers at temperatures under 200 degrees Celsius. We, the inventors, found several translucent polymers, according to the ASTME, that exhibit the property to melt at a temperature below 200 degrees Celsius. The inventors experimented with polymers including low density polyethylene (LDPE), which melts at 125 degrees Celsius and high density polyethylene (HDPE) which, according to the ASTME, melts at 150 degrees Celsius.

We, the inventors, also explored utilizing semiconductor circuits which are known to become unstable above 125 degrees Celsius based on its composition as temperature affects the energy band gap. (This property is documented by D. Wolpert and P. Ampadu, "Managing Temperature Effects in Nanoscale Adaptive Systems", DOI 10.1007/978-1-4614-0748—cited as number 8 in the LIST OF NON-PATENT DOCUMENTS above)

We, the inventors, explored the use of micro-encapsulated fragrances in a thermomorphic substance, which on heating, release an odor so that a trained dog or other animal could locate a point of conductivity disrupted with the kinetic force. We also studied use of water, which is thermomorphic, releasing steam above 100 degrees Celsius at sea level. For cold climates, sodium chloride, ethylene glycol, or another substance that prevents freezing, could be added.

In reduction to practice, we produced and experimented with several forms of prototype devices made according to the teachings herein. A prototype of a disruptor was constructed using a 3-D printer that operates by heating a strand of acrylonitrile butadiene styrene (ABS), a high temperature polymer, to form a separable body with a central pathway for containing a metal electrically conductive guide that enters the female electrical connector and surrounds the end of the electrical conductor within and similarly surrounds the protruding conductor from the male electrical connector forming a separable joint. In practice, an injection mold would be more efficient. The compartment was filled with $NaHCO_3$ powder (commonly known as baking soda), then capped with an air-tight lid. $NaHCO_3$ was selected for the property of releasing kinetic energy in the form of carbon dioxide gas starting at above 100 degrees Celsius and kinetic energy from release of carbon dioxide gas being fully depleted at around 200 degrees Celsius. When the prototype disruptor was heated to 125 degrees Celsius in a temperature-controlled oven, the heat caused the $NaHCO_3$ sealed within the sealed disruptor cavity to decompose, releasing carbon dioxide gas, which quickly accumulated sufficient kinetic force to break open the lid of the cylinder and separate the disruptor body.

We, the inventors, modified commercial, injection-molded, PV connectivity connectors to incorporate combinations of the sensor and disruptor. To produce exemplary heating caused by corrosion at current typical of that of PV connectivity at the current time, examples of corroded PV connectivity electrically conductive guides and pins were produced. The examples were assembled. The examples worked as described herein establishing that resistive heating within a connector well below the 200 degree Celsius that produces an arc can be means to disrupt unsafe connectivity preventing the arc from happening. Further, that a combination of the disruptor and a sensor device that detects loss of transmissivity of a translucent polymer strand can cause a logic circuit to produce a future risk of arcing signal. The purpose of the signal is to alert of pending danger from a DC arc at a distant future time.

CONCLUSIONS, RAMIFICATIONS, AND SCOPE

The present invention has been described in terms of the preferred embodiment, and it is recognized that equivalents, alternatives, and modifications (aside from those expressly stated), are possible and within the scope of the appending claims.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. For example, the connectivity can be within a junction box, a panel, or electronic assembly. The invention should therefore not be limited by the above described embodiment, method, and examples, but by all embodiments and methods within the scope and spirit of the invention.

The previous description of specific embodiments is provided to enable any person skilled in the art to make or use the present invention. The various modifications to these embodiments will be readily apparent to those skilled in the art, and the generic principles defined herein may be applied to other embodiments without the use of the inventive faculty. Each protecting apparatus can include different arrangements of sensors and disruptors depending on the functionality required. The embodiments presented in this application focus on preventing arc-faults in PV power systems, but can be applied in any situation where arc-faults can result in loss of life and destruction of property. Thus, the present invention is not intended to be limited to the embodiments shown herein, but is to be accorded the widest scope consistent with the principles and novel features disclosed herein and as defined by the following claims.

What is claimed is:

1. An apparatus for providing protection from unsafe conditions of electrical connectivity; the apparatus comprising: a proximal portion and a distal portion adapted to be connected with relative translation along a connection axis (X), characterized in that said proximal portion, comprises at least one electrically conductive guide adapted (1) to contact pair wise with corresponding electrical conductor of the distal portion, and (2) to permit relative movement of an electrically conductive pin within the electrically conductive guide along the connection axis (X) between a release position, which means free relative to said proximal portion electrically conductive guide and a joined position, in which the electrically conductive guide contacts with the electrically conductive pin; one or both of the proximal and distal portion further comprising a magazine with a thermomorphic substance therein, the thermomorphic substance selected for the property of state change that releases molecular kinetic energy at elevated temperature in quantity sufficient to cause relative movement of the electrically conductive pin with respect to the electrically conductive guide along the connection axis (X) to the release position.

2. The apparatus of claim 1, further comprising a mechanism to augment the kinetic force.

3. The apparatus of claim 1, wherein the unsafe condition is an electrical arc.

4. The apparatus of claim 1, wherein the thermomorphic substance is compounded with a fire suppressant.

5. An apparatus for mitigation of unsafe condition in electrical connectivity comprising: a separable body with a distal end and a proximal end extending in a mating direction along a connection axis (X); said separable body comprising a hollow channel, a separable electrically conductive guide; a plurality of enclosed gas impermeable cavities containing a thermomorphic substance selected from thermomorphic substances which, above a certain temperature, produce gas byproduct capable of producing sufficient kinetic force to separate the separable body and open the electrical connectivity.

6. The apparatus of claim 5, further comprising a spring mechanism to augment the kinetic force generated by the thermomorphic substance.

7. The apparatus of claim 5, wherein the unsafe condition is an electrical arc.

8. The apparatus of claim 5, wherein the thermomorphic substance additionally is compounded with a fire suppressant.

9. The apparatus of claim 5 further comprising: at least one comparator that compares one or more characteristic of the connectivity with a threshold and, based on the comparison, generates an unsafe condition signal to separate the separable body.

10. The apparatus of claim 9, further comprising a means for separating the separable body upon receiving said kinetic force.

11. The apparatus of claim 10, wherein energy for the comparator and the means for separating the separable body is electricity conducted by the apparatus.

12. The apparatus of claim 9, wherein the unsafe condition is an electrical arc.

13. An apparatus for providing protection of unsafe electrical connectivity in a photovoltaic (PV) system comprising: at least one comparator to generate a threshold unsafe signal indicative of a risk of an unsafe condition in the PV system prior to an unsafe event by comparing at least one characteristic of said connectivity with the comparator and to determine a need to disrupt said electrical connectivity and, upon determining the need to disrupt, disrupts said connectivity by activating molecules and of a kinetic compound by way of a need to disrupt signal.

14. The apparatus of claim 13, comprising said at least one comparator compares one or more thermal characteristic of the connectivity with a threshold and, based on the comparison, generates at least one of an unsafe condition signal and the need to disrupt signal.

15. The apparatus of claim 13, further comprising a means for activating separation of a separable body to disrupt connectivity upon receiving the need to disrupt signal.

16. The apparatus of claim 13, wherein energy to power apparatus components which require energy to operate is energy conducted by the apparatus.

* * * * *